(12) United States Patent
Feenan

(10) Patent No.: US 6,492,816 B1
(45) Date of Patent: Dec. 10, 2002

(54) ACOUSTIC LINER FOR MRI GRADIENT COILS

(76) Inventor: Peter John Feenan, 6 Broadmarsh Lane, Freeland, Witney, Oxfordshire (GB), OX8 8AN ( * ) Notice: Subject to any disclaimer, the term of this patent is extended or adjusted under 35 U.S.C. 154(b) by 0 days.

(21) Appl. No.: 09/857,555
(22) PCT Filed: Oct. 9, 2000
(86) PCT No.: PCT/GB00/03890
§ 371 (c)(1),
(2), (4) Date: Jun. 7, 2001
(87) PCT Pub. No.: WO01/25808
PCT Pub. Date: Apr. 12, 2001

(30) Foreign Application Priority Data

Oct. 7, 1999 (GB) .............................................. 9923648

(51) Int. Cl.⁷ .................................................. G01V 3/00
(52) U.S. Cl. ........................ 324/318; 324/309; 324/319
(58) Field of Search ................................. 324/318, 319, 324/322, 309, 314, 316; 335/296; 128/653.5

(56) References Cited

U.S. PATENT DOCUMENTS

| 5,256,969 | A | * | 10/1993 | Miyagima et al. | ........... 324/318 |
| 5,617,024 | A | * | 4/1997 | Yoshimo et al. | ............. 324/318 |
| 5,764,059 | A | * | 6/1998 | Mansfield | ................... 324/318 |
| 5,886,548 | A | * | 3/1999 | Doty et al. | .................. 324/318 |
| 5,990,680 | A | * | 11/1999 | Mansfield | ................... 324/318 |
| 6,081,117 | A | * | 7/2000 | Crowley et al. | ............. 324/318 |

* cited by examiner

Primary Examiner—Edward Lefkowitz
Assistant Examiner—Brij B. Shrivastav
(74) Attorney, Agent, or Firm—Young & Thompson

(57) ABSTRACT

The invention describes an acoustic liner for use with a magnetic field gradient coil, especially for use in magnetic resonance imaging (MRI) systems. The liner comprises an acoustic sheet (12), preferably of compressible material, adapted to be fitted to the gradient coil, and an acoustic conducting path (10) for carrying an electrical current provided on or in the sheet, arranged such that in use a current pulse can be applied to the gradient coil and a current pulse can be applied to the acoustic conducting path in synchronism therewith, wherein the acoustic conducting path is arranged such that Lorentz forces on the acoustic conducting path in a magnetic field cause the acoustic conducting path to move relative to the gradient coil in such a way that the inner surface (9) of said acoustic sheet remains substantially stationary.

19 Claims, 2 Drawing Sheets

ACOUSTIC LINER FOR MRI GRADIENT COILS

The invention relates to acoustic liners for magnetic field gradient coils, in particular those used for magnetic resonance imaging (MRI).

In a magnetic resonance imaging (MRI) system, a gradient coil is employed to produce a linear magnetic field gradient, defined with respect to 3 orthogonal directions (X, Y and Z). The gradient coil is often a cylindrical structure placed in the center of the bore of a superconducting magnet where a strong and stable magnetic field exists. The gradient coil generally consists of a set of copper conductors arranged in a pattern around the surface of the cylindrical structure. The pattern is calculated to produce the linear field gradient, and methods of calculation and construction of such gradients are well described in the literature. Most gradient coils are of the 'active screened' type whereby a primary and secondary set of conductors are provided spaced radially apart and connected in series opposition so as to cancel any external field. This arrangement is used in order to reduce eddy currents induced in conducting materials, for example the cryogenics of a superconducting magnet, located outside the structure.

The gradient coils do not normally provide a constant static field gradient. In operation, a pulse of current is applied to the gradient coils to produce the required field gradients over a short period of time. There are a variety of different pulse sequences commonly used. Most current pulses have a short 'rise-time' of the order of 1 millisecond and are repeated at regular intervals during the acquisition of an image.

A common problem with gradient coils is the acoustic noise which is generated during operation.

When a current pulse is applied to the gradient coils in the presence of a magnetic field, a Lorentz force acts on the conductors, causing them to move. Since the pulses are applied at a relatively high frequency, the result is that the gradient coil structure vibrates, creating acoustic noise. As most MRI systems are designed such that there is a patient in the form of a person or animal located inside the magnet and gradient coils, this acoustic noise can be uncomfortable for the patient. Indeed, as magnetic fields become larger and higher gradient strengths are used the acoustic noise can be so intense as to constitute a danger to the patient's hearing, and measures must be taken to protect the patient from it.

A need therefore exists to reduce or eliminate the acoustic noise produced by a gradient coil.

Previous attempts at reducing the noise have tended to concentrate on making the structure of the gradient coils as stiff and as heavy as possible to reduce the amplitude of vibration, or to provide a layer of 'soundproofing' material within the gradient in order to absorb the mechanical energy.

U.S. Pat. No. 5,764,059 discloses a means of reducing acoustic noise by encasing closed loop conductive pathways in a potting material chosen to maximise the velocity of sound within it. The Lorentz forces acting on different parts of each loop cancel each other so that the total resultant force on the loop is zero. The vibration of opposite sides of each loop with respect to each other is prevented by means of encasing the loop in rigid material.

The present invention provides an acoustic liner for use with a magnetic field gradient coil in a magnetic resonance imaging (MRI) system, the liner comprising an acoustic sheet, adapted to be fitted to the gradient coil in such a way that the inner surface of the sheet is movable relative to the gradient coil, and an acoustic conducting path for carrying an electrical current provided within or connected to the sheet, arranged such that in use a current pulse can be applied to the gradient coil and a current pulse can be applied to the acoustic conducting path in synchronism therewith, wherein the acoustic conducting path is arranged such that Lorentz forces on the acoustic conducting path in the magnetic field produced by the MRI system cause the acoustic conducting path to move relative to the gradient coil in such a way that the inner surface of said sheet remains substantially stationary.

The acoustic conducting path is preferably in the form of a coating which is so thin that it is flexible, to which can be applied a current pulse in synchronisation with the current pulse applied to the gradient coil. The compressible material may be rubber foam.

When a current pulse is applied to the gradient coils, a corresponding pulse is applied to the acoustic conducting path and there will be a Lorentz force on the acoustic conducting path, just as there will be on the gradient coils. This will cause it to move and compress (or expand) the flexible compressible material. If the phase and amplitude of the current pulse are chosen to cause the inner skin to move an equal and opposite amount to the original gradient inner surface then the net movement of the surface of the sheet of compressible material will be zero. As this is the surface in contact with the air, little or no sound will be generated.

The gradient coil is very stiff whilst the sheet is very compressible. The force required to cause movement of the compressible sheet is therefore much less than the force required to cause the same movement of the gradient coil. Therefore that the current required to move the acoustic coils is much less than the current used to drive the gradient coil.

The acoustic conducting path will obviously have an effect on the magnetic field gradient generated. Due to the fact that the current through it is much less than the current through the gradient coils this will not always be significant, but it is important to minimize this effect to prevent any interference with the imaging process.

One way of achieving this is to provide that the liner flirter comprises an additional acoustic conducting path for carrying an electrical current located on the surface of the sheet of flexible, compressible material adapted to be fitted to the magnetic field gradient coil. Preferably the acoustic conducting path and the additional acoustic conducting path are connected in series opposition.

The acoustic conducting path and the additional acoustic conducting path may comprise identical conducting paths separated by the sheet of compressible material.

As the two conducting paths are wired in opposition the current flowing on one side of the compressible material will be in the opposite direction to the current flowing on the other at all positions and the net magnetic field produced will be small. A refinement to this is to calculate the two conducting paths either side of the compressible material to be slightly different such that the net magnetic field produced by the pair at the center is further reduced.

Preferably the acoustic conducting path and the additional acoustic conducting path are arranged such that the coupling between the gradient coil and the sum of the acoustic conducting path and the additional acoustic conducting path is substantially zero. This will ensure that little or no current or voltage will be induced by the gradient coil across the pair of conducting paths.

The acoustic conducting path and additional acoustic conducting path may be arranged such that there is a mutual inductance between the acoustic conducting paths and the gradient coil, whereby the resistance, inductance and coupling constant to the gradient coil are such that the induced current and corresponding decay characteristic in the acoustic conducting paths achieve at least in part the desired acoustic cancellation.

An alternative method of providing acoustic conducting paths which will not interfere with the imaging process is to arrange for a single pattern on the inner skin of the liner, wherein the pattern itself is arranged to produce a linear field gradient whilst still matching as closely as possible the vibration pattern of the gradient coil. If this field is small compared to the field produced by the gradient then it can be accommodated without detriment to the imaging process by 'signal conditioning' of the gradient drive such that the gradient field and the field produced by the acoustic conducting path add to produce the resultant field originally required.

An alternative embodiment of the invention is to use a rigid tube as the acoustic liner, but provide active support means at a plurality of points around its surface between the gradient coil and acoustic liner it e.g. piezoelectric position transducers. During operation of the gradient coils an appropriate signal is applied to the active support means in anti-phase to the vibration of the gradient coil at the position of each support means such that the motion of the acoustic liner is cancelled.

According to a second aspect, the invention provides a means for generating a magnetic field gradient, comprising a field gradient coil, an acoustic sheet, fitted to the gradient coil in such a way that the inner surface of the sheet is movable relative to the gradient coil an acoustic conducting path for carrying an electrical current provided within or connected to the sheet, means for providing a current pulse to the field gradient coil and a current pulse to the acoustic conducting path in synchronism, wherein the acoustic conducting path and the means for providing a current pulse thereto are arranged such that, in use, Lorentz forces on the acoustic conducting path cause the acoustic conducting path to move relative to the gradient coil in such a way that the inner surface of said sheet remains substantially stationary.

In a further embodiment of the invention, a similar acoustic liner is applied to the ends of the magnet structure. The gradient coil is mounted to the magnet and its vibration will be transmitted to the magnet itself which will produce acoustic noise. The acoustic liner at the end would take the form of a substantially flat 'pancake' fixed to each end and would prevent acoustic noise being transmitted into the room occupied by the magnet.

A preferred embodiment of the invention will now be described by way of example only and with reference to the accompanying drawings, in which.

Figure 1:
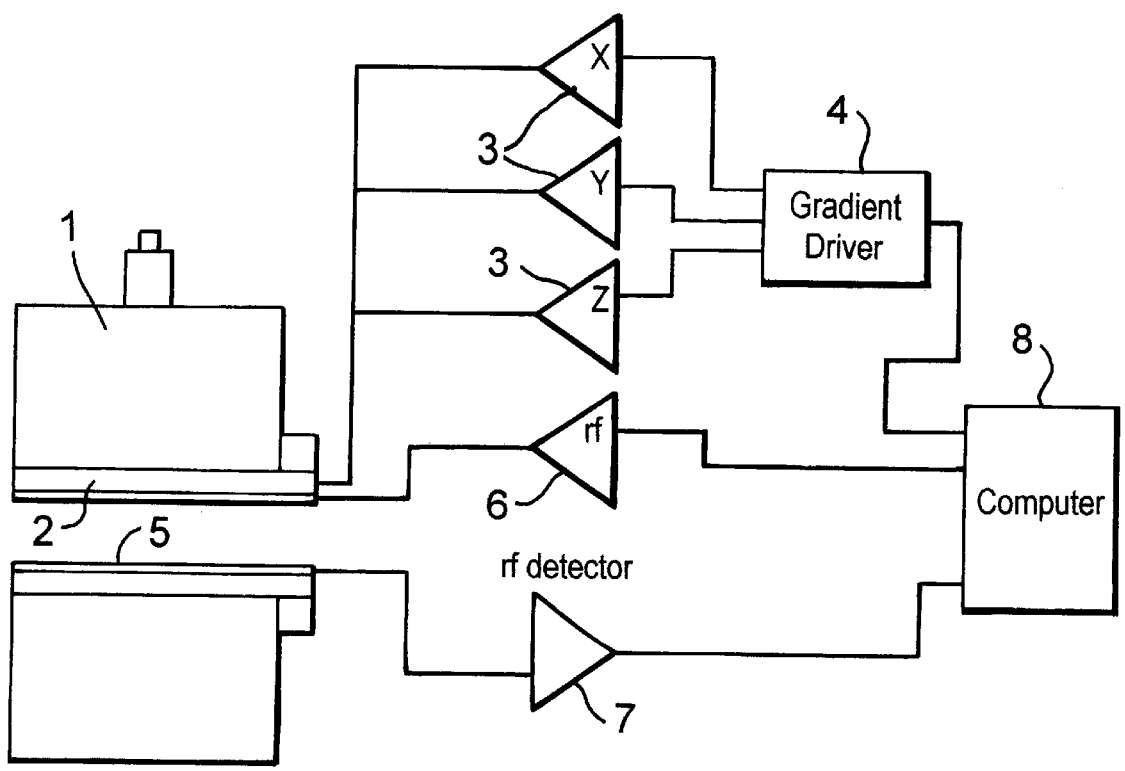
FIG. 1 shows the components of an MRI system.

FIG. 1 shows schematically the major elements of a Magnetic Resonance Imaging (MRI) system. A superconducting, resistive or permanent magnet 1 provides a stable homogeneous high magnetic field (from around 0.1 Tesla to around 9.0 Tesla) in a patient volume of typically 0.5 meters to 1.5 meters diameter. A gradient coil 2 is placed centrally in the magnet bore and is physically mounted either to the magnet 1 or to a separate floor mounted support (not shown). The gradient coil 2 is connected via heavy duty current leads to a set of gradient amplifiers 3. The gradient amplifiers are fed a pre-conditioned signal from gradient driver electronics 4. A radio frequency (rf) coil 5 is placed in the bore of the gradient coil and is fed by an rf amplifier 6. An rf detector 7 amplifies the signal from the rf coil. This amplified signal is fed to a computer 8 which processes the signal to, ultimately, provide the image.

Figure 2:
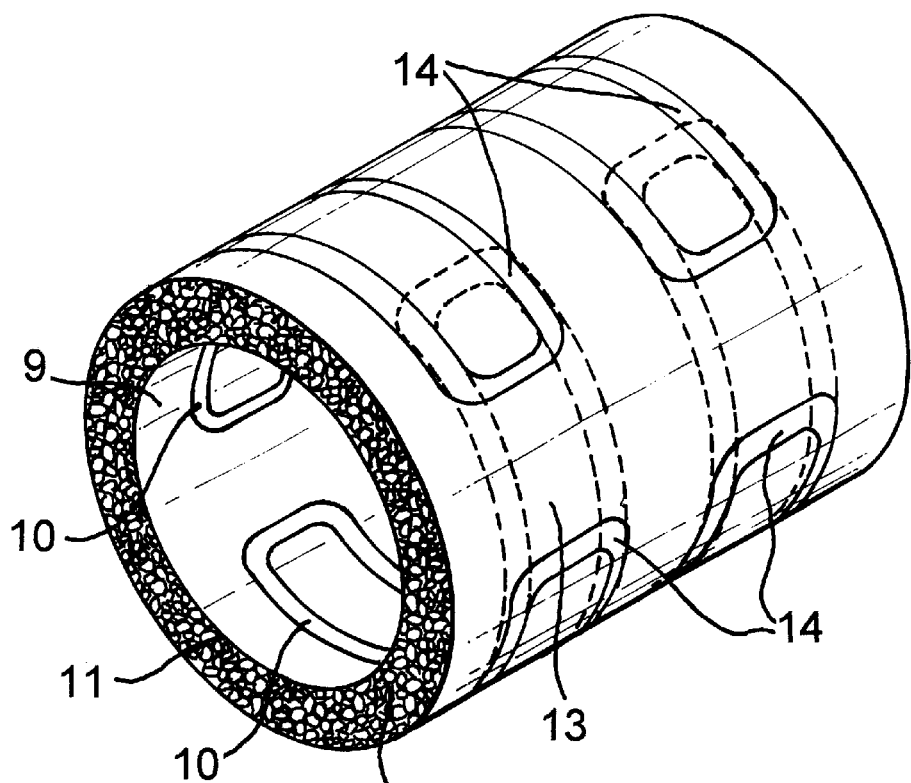
FIG. 2 shows the construction of an acoustic liner.

FIG. 2 shows an embodiment of the acoustic liner according to the invention. An inner flexible sheet 9 is provided with a pattern of copper conductors 10 thereon. Preferably this material is a double sided copper coated Mylar which has had the particular pattern of conductors 10 etched onto each surface. Preferably, X type patterns are on one side of the flexible sheet 9 and Y type patterns on the other. A second inner, single-sided, flexible sheet 11 is provided with Z type conducting patterns etched onto it and placed over and bonded to the first flexible sheet 9 on a suitable cylindrical mandrel. A thin (approximately 5 mm) compressible insulating material 12 such as neoprene foam is placed over the two conducting sheets 9 and 11 and is bonded to them. An outer flexible sheet 13 with a pattern of copper conductors 14 on it is placed over and bonded to the foam 12 with preferably X type patterns on one side and Y type patterns on the other. A second outer, single-sided, flexible sheet, (not shown) is provided with Z type conducting patterns etched onto it and placed over and bonded to the first outer flexible sheet 13. The complete sandwich construction is placed in the bore of a gradient coil 2 and bonded to the surface of it. The inner and outer X patterns are connected electrically in senries opposition. The inner and outer Y patterns are connected electrically in series opposition. The inner and outer Z patterns are connected electrically in series opposition. The number of turns on the inner and outer conducting patterns of a pair are calculated to produce very small field at their center and to produce very small mutual inductance between themselves and the gradient coil of the same symmetry when connected in series opposition. An audio amplifier 3 is connected to each of the sets of acoustic coils and is driven by a suitable signal derived from the drive signal 4 of the gradient coil 2 Optionally this drive signal 4 is first pre-conditioned to more closely match the amplitude and phase variation of the gradient surface vibration with time.

The flexible compressible material 11 can be any suitable material which is compressible and electrically non-conducting e.g. a honeycomb structure.

The conducting patterns 10, 14 can be fabricated by any suitable process e.g. etching copper sheet, cutting a conducting sheet, winding conducting tape or wire.

Generally speaking the coupling between the gradient coil 15 and the acoustic coils 10, 14 should be zero so that no current or voltage will be induced across the pair of acoustic coils 10, 14 while driving current through the gradient coil 10. This can be important since the voltage induced in the acoustic coils can be of the order of kilovolts while the drive voltage of the acoustic coils is typically only tens of volts.

As a refinement, the acoustic coils 10, 14 can be a closed loop designed with appropriate imbalance of turns between the inner and outer to give rise to mutual inductance between itself and the gradient coil 2, whereby the resistance, inductance and coupling constant to the gradient coil 2 are such that the induced current and corresponding decay characteristic achieve, at least in part, the desired acoustic cancellation without the need for a separate driver amplifier.

Figure 3:
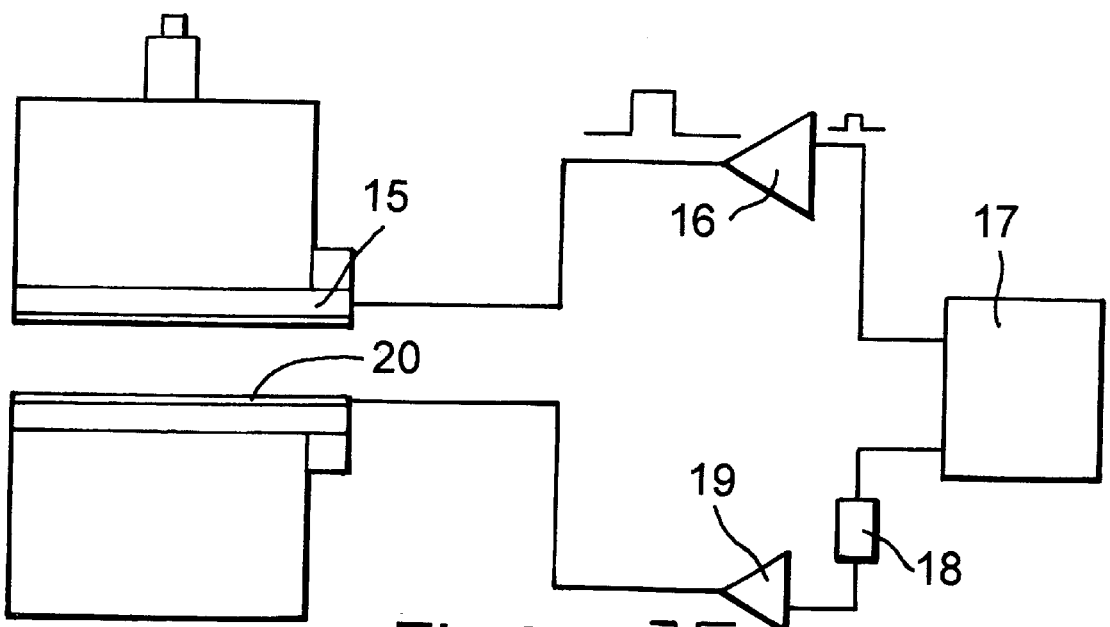
FIG. 3 shows in block diagram form the system for driving the acoustic liner.

FIG. 3 shows the basic elements of the drive for the acoustic liner. A gradient coil 15 is driven from a gradient amplifier 16 which receives its demand signal from a pulse sequence generator 17. The same pulse sequence generator feeds the same signal to a pre-conditioning circuit 18 which in turn feeds an acoustic amplifier 19 which in turn drives the acoustic liner 20.

In order to provide maximum acoustic cancellation it is preferable for the movement of the skin 9 of the acoustic liner to exactly cancel the movement of the gradient surface 13 at all points on its surface and at all times during the pulsing of the gradient. The movement of the gradient surface 13 can be expressed as a series of 'normal modes' of vibration. A normal mode will cause the surface to distort with a particular shape. The shape of each normal mode will remain constant but will have a different amplitude and time dependence from the other normal modes. The pattern of conductors 10 applied to the acoustic liner must therefore produce a movement of the surface 13 equivalent to as many of the normal modes of vibration as practicable, and each will be fed with a different time dependent drive to match the response of each particular normal mode of vibration. The normal modes of vibration and their time-dependence can be calculated by means of a finite element stress analysis which includes the mechanical details of the structure and electro-magnetic characteristics of the gradient coil 2. The conducting pattern 10 can then be calculated by providing a density of turns which is made to vary as the amplitude of vibration at different points on the surface of the coil. Alternatively, the vibration modes can be measured by means of a small local microphone or vibration sensor (not shown) which detects the amplitude and phase of vibration over a mesh of points on the surface of the gradient coil 2. Note that the method of mounting the gradient coils 2 will have an effect on the normal modes of vibration and these calculations or measurements must be done with the mounting method in place.

The drive current for the acoustic coils 10, 14 must be synchronised with the drive current to the gradient coils 2. This can be achieved by taking the same command signal that is given to the amplifier driving the gradient coils and performing the appropriate signal conditioning before feeding it to the amplifier driving the acoustic coils. For example, the leading and trailing edges of the command pulse would be made to produce a ringing of the appropriate frequency, phase and decay characteristics as the gradient vibration. The amplitude is adjusted until the maximum acoustic attenuation is achieved.

The current supplied to the acoustic coils can be part of a closed loop feedback system. A sensor e.g. a piezoelectric sensor, can be attached to the inner skin 9 of the acoustic liner and its output amplified and fed back to the acoustic coils 10, 14 to maintain zero vibration. Or alternatively a microphone can be situated in the bore of the magnet and its output amplified and fed back to the acoustic coils to maintain minimum acoustic noise in the bore of the magnet.

It is to be understood that the invention is not limited to the embodiments described above. For example the acoustic sheet is described as consisting of a sheet of compressible material, but could consist of a rigid tube connected to the gradient coil by a series of compressible spacers.

Similarly, although the acoustic coils are described as being positioned at the inner surface of the acoustic sheet, they could be positioned inside the acoustic sheet.

An additional advantage of the invention is that additional signals can be added to drive the acoustic coil to produce desired sounds , e.g. speech to communicate with the patient, or soothing music, or audible stimuli for functional imaging studies.

What is claimed is:

1. An acoustic liner for use with a magnetic field gradient coil in a magnetic resonance imaging (MRI) system, the liner comprising
   an acoustic sheet, adapted to be fitted to the gradient coil in such a way that the inner surface of the sheet is movable relative to the gradient coil, and
   an acoustic conducting path for carrying an electrical current provided within or connected to the sheet,
   arranged such that in use a current pulse can be applied to the gradient coil and a current pulse can be applied to the acoustic conducting path in synchronism therewith, wherein
   the acoustic conducting path is arranged such that Lorentz forces on the acoustic conducting path in the magnetic field produced by the MRI system cause the acoustic conducting path to move relative to the gradient coil in such a way that the inner surface of said sheet remains substantially stationary.

2. An acoustic liner as claimed in claim 1, wherein said acoustic sheet is formed from compressible material.

3. An assembly as claimed in claim 1, further comprising a skin on the second surface of the sheet, wherein the electrically conducting path is located on the surface of the skin.

4. An assembly as claimed in claim 1, wherein the compensating coil is flexible.

5. An assembly as claimed in claim 1, wherein the compensating coil is supported by the sheet.

6. An assembly as claimed in claim 1, further comprising an additional compensating coil located on the first surface of the sheet.

7. An acoustic liner as claimed in claim 6, wherein the acoustic conducting path and the additional acoustic conducting path are connected in series opposition.

8. An assembly as claimed in claim 6, wherein the compensating coil and additional compensating coil are arranged such that in use they produce substantially no magnetic field at their center.

9. An assembly as claimed in claim 6, wherein the compensating coil and the additional compensating coil comprise identical conducting paths separated by the acoustic sheet.

10. An assembly as claimed in claim 6 , wherein the compensating coil and the additional compensating coil are arranged such that the coupling between the gradient coil and the sum of the compensating coil and the additional compensating coil is substantially zero.

11. An assembly as claimed in claim 6, wherein the compensating coil and additional compensating coil are arranged such that there is a mutual inductance between the compensating coils and the gradient coil, whereby the resistance, inductance and coupling constant to the gradient coil are such that the induced current and corresponding decay characteristic in the compensating coils achieve at least in part the desired relative movement between the gradient coil and the compensating coil.

12. An acoustic liner as claimed in claim 11, wherein the acoustic conducting path and additional acoustic conducting path both comprise coils, and the acoustic conducting path and additional acoustic conducting path form a closed loop whereby an imbalance in the number of turns in the coil of the acoustic conducting path and the number of turns in the coil of the additional acoustic conducting path gives rise to the mutual inductance between the acoustic conducting paths and the gradient coil.

13. An acoustic liner as claimed in claim 11, wherein a difference in position or geometry of the acoustic conducting path compared to the additional acoustic conducting path gives rise to the mutual inductance between the acoustic conducting paths and the gradient coil.

14. An assembly as claimed in claim 1, wherein the compensating coil is arranged to generate a linear magnetic field gradient at its center.

15. An assembly as claimed in claim 1, wherein the gradient coil is substantially cylindrical and wherein the first surface of the sheet is in contact with the inside surface of the gradient coil.

16. An assembly as claimed in claim 1, wherein the current supplied to the compensating coil is part of a closed loop feedback system.

17. An acoustic liner as claimed in claim 16, further comprising a microphone located in the center of the gradient coil, the output of the microphone being fed back to the current supply of the acoustic conducting path.

18. An acoustic liner for use in a magnetic field gradient coil, comprising
a rigid tube adapted to be mounted inside the field gradient coil,
active support means fitted to the rigid tube, and
control means for controlling the position of the active support means,
arranged such that in use the movement of the active support means is substantially the same in magnitude as the movement of the gradient coil but in antiphase therewith.

19. A means for generating a magnetic field gradient, comprising
a field gradient coil,
an acoustic sheet, fitted to the gradient coil in such a way that the inner surface of the sheet is movable relative to the gradient coil
an acoustic conducting path for carrying an electrical current provided within or connected to the sheet,
means for providing a current pulse to the field gradient coil and a current pulse to the acoustic conducting path in synchronism, wherein
the acoustic conducting path and the means for providing a current pulse thereto are arranged such that, in use, Lorentz forces on the acoustic conducting path cause the acoustic conducting path to move relative to the gradient coil in such a way that the inner surface of said sheet remains substantially stationary.

* * * * *